(12) United States Patent
Rashed et al.

(10) Patent No.: US 11,444,031 B2
(45) Date of Patent: *Sep. 13, 2022

(54) SEMICONDUCTOR DEVICE WITH TRANSISTOR LOCAL INTERCONNECTS

(71) Applicant: GLOBALFOUNDRIES U.S. Inc., Santa Clara, CA (US)

(72) Inventors: Mahbub Rashed, Santa Clara, CA (US); Irene Y. Lin, Los Altos Hills, CA (US); Steven Soss, Cornwall, NY (US); Jeff Kim, San Jose, CA (US); Chinh Nguyen, Austin, TX (US); Marc Tarabbia, Pleasant Valley, NY (US); Scott Johnson, Wappingers Falls, NY (US); Subramani Kengeri, San Jose, CA (US); Suresh Venkatesan, Danbury, CT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 117 days.

This patent is subject to a terminal disclaimer.

(21) Appl. No.: 17/039,187

(22) Filed: Sep. 30, 2020

(65) Prior Publication Data

US 2021/0013150 A1 Jan. 14, 2021

Related U.S. Application Data

(60) Continuation of application No. 16/502,521, filed on Jul. 3, 2019, now Pat. No. 10,833,018, which is a
(Continued)

(51) Int. Cl.
*H01L 23/535* (2006.01)
*H01L 21/8234* (2006.01)
(Continued)

(52) U.S. Cl.
CPC ...... *H01L 23/535* (2013.01); *H01L 21/28518* (2013.01); *H01L 21/76895* (2013.01);
(Continued)

(58) Field of Classification Search
None
See application file for complete search history.

(56) References Cited

U.S. PATENT DOCUMENTS 7,917,879 B2 3/2011 Becker et al.
8,049,334 B1 11/2011 Halliyal et al.
(Continued)

FOREIGN PATENT DOCUMENTS

CN 1725499 A 1/2006
KR 10-1998-052466 9/1998
KR 10-2004-0074261 8/2004

OTHER PUBLICATIONS

State Intellectual Property Office of The People's Republic of China, First Office Action for Chinese Patent Application Mo 201210539484.8, dated Jan. 6, 2015.
(Continued)

*Primary Examiner* — Cory W Eskridge
(74) *Attorney, Agent, or Firm* — Francois Pagette; Hoffman Warnick LLC

(57) ABSTRACT

A semiconductor device is provided for implementing at least one logic element. The semiconductor device includes a semiconductor substrate. The first transistor and a second transistor are formed on the semiconductor substrate. Each transistor comprises a source, a drain, and a gate. The gate of the first transistor extends longitudinally as part of a first linear strip and the gate of the second transistor extends longitudinally as part of the second linear strip parallel to and spaced apart from the first linear strip. A first CB layer forms a local interconnect layer electrically connected to the
(Continued)

gate of the first transistor. A second CB layer forms a local interconnect layer electrically connected to the gate of the second transistor. A CA layer forms a local interconnect layer extending longitudinally between a first end and a second end of the CA layer. The CA layer is electrically connected to the first and second CB layers. The first CB layer is electrically connected adjacent the first end of the CA layer and the second layer is electrically connected adjacent the second end of the CA layer. The first CB layer, the second CB layer and the CA layer are disposed between a first metal layer and the semiconductor substrate. The first metal layer being disposed above each source, each drain, and each gate of the first and second transistors. The CA layer extends substantially parallel to the first and second linear strips and is substantially perpendicular to the first and second CB layers. At least one via selectively provides an electrical connection between the CA or CB layers and the at least one metal layer.

13 Claims, 7 Drawing Sheets

Related U.S. Application Data continuation of application No. 15/164,114, filed on May 25, 2016, now abandoned, which is a division of application No. 13/324,740, filed on Dec. 13, 2011, now Pat. No. 9,355,910.

(51) Int. Cl.
| | | |
|---|---|---|
| *H01L 27/02* | (2006.01) | |
| *H01L 21/768* | (2006.01) | |
| *H01L 21/285* | (2006.01) | |
| *H01L 21/8238* | (2006.01) | |
| *H01L 23/532* | (2006.01) | |
| *H01L 27/092* | (2006.01) | |
| *H01L 29/08* | (2006.01) | |
| *H01L 27/118* | (2006.01) | |

(52) U.S. Cl.
CPC ........... *H01L 21/823418* (2013.01); *H01L 21/823475* (2013.01); *H01L 21/823814* (2013.01); *H01L 21/823871* (2013.01); *H01L 23/53238* (2013.01); *H01L 27/0207* (2013.01); *H01L 27/092* (2013.01); *H01L 29/0847* (2013.01); *H01L 27/11807* (2013.01); *H01L 2924/0002* (2013.01)

(56) References Cited

U.S. PATENT DOCUMENTS

| | | |
|---|---|---|
| 2003/0003640 A1 | 1/2003 | Lee |
| 2004/0021226 A1 | 2/2004 | Geffken et al. |
| 2004/0097021 A1 | 5/2004 | Augusto et al. |
| 2006/0019488 A1 | 1/2006 | Liaw |
| 2007/0141834 A1 | 6/2007 | Kwon et al. |
| 2008/0179676 A1 | 7/2008 | Hirano et al. |
| 2009/0224317 A1* | 9/2009 | Becker .............. H01L 23/49844 257/773 |
| 2012/0292704 A1 | 11/2012 | Anderson |

OTHER PUBLICATIONS

State Intellectual Property Office of The People's Republic of China, Third Office Action for Chinese Patent Application No. 201210539484.8, dated Mar. 23, 2016.

Intellectual Property Office, Office Action for German Patent Application No. 10 2012 219 375.8, dated Jul. 17, 2018 and English Translation of Official Communication.

\* cited by examiner

SEMICONDUCTOR DEVICE WITH TRANSISTOR LOCAL INTERCONNECTS

CROSS-REFERENCE TO RELATED APPLICATIONS

This application is a continuation of application Ser. No. 16/502,521 filed on Jul. 3, 2019, which was a continuation of application Ser. No. 15/164,114 filed on May 25, 2016, which was a divisional of application Ser. No. 13/324,740 filed on Dec. 13, 2011.

FIELD OF THE INVENTION

The present invention generally relates to semiconductor devices, and more particularly relates to local interconnects between transistors in semiconductor devices.

BACKGROUND OF THE INVENTION

As the size of semiconductor devices continues to decrease, the ability to create standard cell library logic devices, such as scan-D flip-flops and multiplexers, becomes more difficult. This is particularly the case at the 20 nm node, where lithographic limitation results in a lack of scaling of standard cell library devices. Cross-coupling of transistors is critical to the scaling of key stand cell library devices. Without cross-coupling, logic scaling will take up more area of the semiconductor device. Furthermore, traditional cross-coupling utilizing a standard metal layer will also occupy large amounts of area. Either of these conditions is obviously undesirable, leading to a larger semiconductor device or less functionality in the semiconductor device.

Accordingly, it is desirable to provide cross-coupling of transistors without reliance on a standard metal layer to produce standard cell library devices while conserving semiconductor device area. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In one aspect of the invention, the semiconductor device includes a semiconductor substrate; a first transistor and a second transistor formed on the semiconductor substrate, wherein each transistor comprises a source, a drain, and a gate, wherein the gate of the first transistor extends longitudinally as part of a first linear strip and wherein the gate of the second transistor extends longitudinally as part of the second linear strip parallel to and spaced apart from the first linear strip; a first CB layer forming a local interconnect layer electrically connected to the gate of the first transistor; a second CB layer forming a local interconnect layer electrically connected to the gate of the second transistor; a CA layer forming a local interconnect layer extending longitudinally between a first end and a second end of the CA layer, wherein the CA layer is electrically connected to the first and second CB layers; wherein the first CB layer is electrically connected adjacent the first end of the CA layer and the second layer is electrically connected adjacent the second end of the CA layer, wherein the first CB layer, the second CB layer and the CA layer are disposed between a first metal layer and the semiconductor substrate, the first metal layer being disposed above each source, each drain, and each gate of the first and second transistors, and wherein the CA layer extends substantially parallel to the first and second linear strips and is substantially perpendicular to the first and second CB layers; and at least one via selectively providing an electrical connection between the CA or CB layers and the at least one metal layer.

In another aspect of the invention, the semiconductor device includes a semiconductor substrate; a first transistor and a second transistor formed on the semiconductor substrate, wherein each transistor comprises a source, a drain, and a gate, wherein the gate of the first transistor extends longitudinally as part of a first linear strip and wherein the gate of the second transistor extends longitudinally as part of the second linear strip parallel to and spaced apart from the first linear strip; a first CB layer forming a local interconnect layer electrically connected to the gate of the first transistor; a second CB layer forming a local interconnect layer electrically connected to the gate of the second transistor; a CA layer forming a local interconnect layer extending longitudinally between a first end and a second end of the CA layer, wherein the CA layer is electrically connected to the first and second CB layers; wherein the first CB layer is electrically connected adjacent the first end of the CA layer and the second layer is electrically connected adjacent the second end of the CA layer, wherein the first CB layer, the second CB layer and the CA layer are disposed between a first metal layer and the semiconductor substrate, the first metal layer being disposed above each source, each drain, and each gate of the first and second transistors, and wherein the CA layer extends substantially parallel to the first and second linear strips and is substantially perpendicular to the first and second CB layers; and at least one via selectively providing an electrical connection between the CA layer and the at least one metal layer.

In yet another aspect of the invention, the semiconductor device includes a semiconductor substrate; a first transistor and a second transistor formed on the semiconductor substrate, wherein each transistor comprises a source, a drain, and a gate, wherein the gate of the first transistor extends longitudinally as part of a first linear strip and wherein the gate of the second transistor extends longitudinally as part of the second linear strip parallel to and spaced apart from the first linear strip; a first CB layer forming a local interconnect layer electrically connected to the gate of the first transistor; a second CB layer forming a local interconnect layer electrically connected to the gate of the second transistor; a CA layer forming a local interconnect layer extending longitudinally between a first end and a second end of the CA layer, wherein the CA layer is electrically connected to the first and second CB layers; wherein the first CB layer is electrically connected adjacent the first end of the CA layer and the second layer is electrically connected adjacent the second end of the CA layer, wherein the first CB layer, the second CB layer and the CA layer are disposed between a first metal layer and the semiconductor substrate, the first metal layer being disposed above each source, each drain, and each gate of the first and second transistors, and wherein the CA layer extends substantially parallel to the first and second linear strips and is substantially perpendicular to the first and second CB layers; and at least one via selectively providing an electrical connection between one of the CB layers and the at least one metal layer.

BRIEF DESCRIPTION OF THE DRAWINGS

The present invention will hereinafter be described in conjunction with the following drawing FIG.s, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Referring to the figures, wherein like numerals indicate like parts throughout the several views, a semiconductor device 20 is shown and described herein. The semiconductor device 20 may be part of an integrated circuit (not separately numbered) as is well recognized by those skilled in the art.

Figure 1:
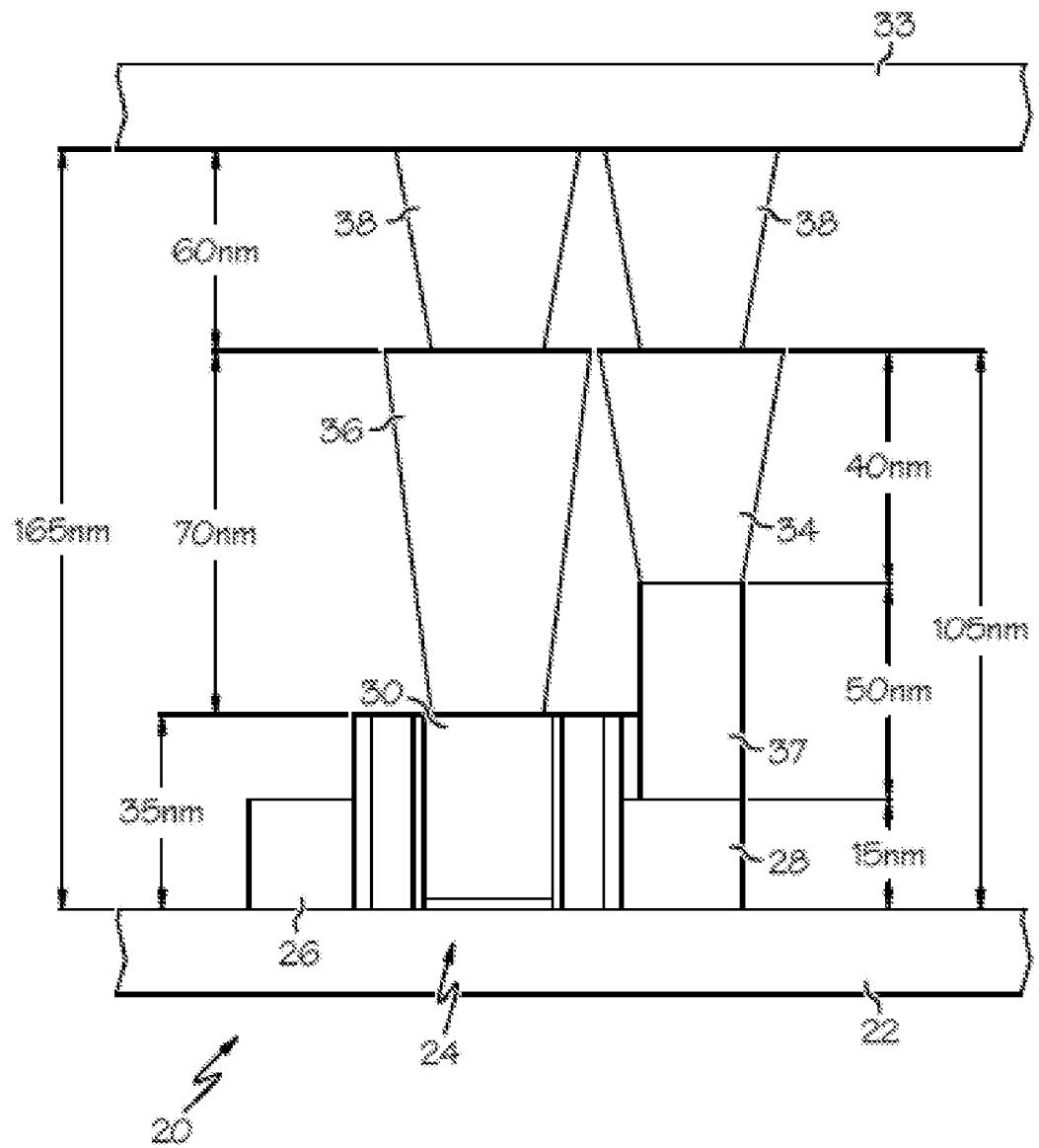
FIG. 1 is a cross-sectional side view of a portion of a semiconductor device.

Referring to FIG. 1, the semiconductor device 20 includes a semiconductor substrate 22. The semiconductor device 20 includes a plurality of transistors 24. Specifically, in the illustrated embodiments, the transistors 24 are field-effect transistors (FETs) and more specifically, metal-oxide-semiconductor field-effect transistors (MOSFETs). Each of the transistors 24 includes a source 26, a drain 28, and a gate 30.

The sources 26 and drains 28 are formed in and/or on the substrate 22 using techniques that are well known to those skilled in the art. In the illustrated embodiments, the sources 26 and drains 28 are formed as raised sources 26 and drains 28, i.e., at least a portion of the sources 26 and drains 28 are formed above the substrate 22. In the configuration shown in FIG. 1, the raised source 26 and drain 28 each extend about 15 nm above the substrate 22. However, other dimensions may be alternatively realized. The raised sources 26 and drains 28 may be formed using embedded silicon germanium (eSiGe) techniques as is appreciated by those skilled in the art. Of course, other techniques to may be implemented to form the raised sources 26 and drains 28. Furthermore, in other embodiments (not shown), the sources 26 and drains 28 may not be raised above the substrate 22.

The gates 30 are typically formed above the substrate 22 using techniques well known to those skilled in the art. In the illustrated embodiments, the gates 30 are formed primarily of polycrystalline silicon, commonly referred to as polysilicon or simply PolySi, disposed above the substrate 22. However, the gates 30 may also be formed from other materials, e.g., a high-κ metal. In the configuration shown in FIG. 1, the gate 30 extends about 35 nm above the substrate 22. However, other dimensions for the gates 30 may be alternatively realized.

Figure 2:
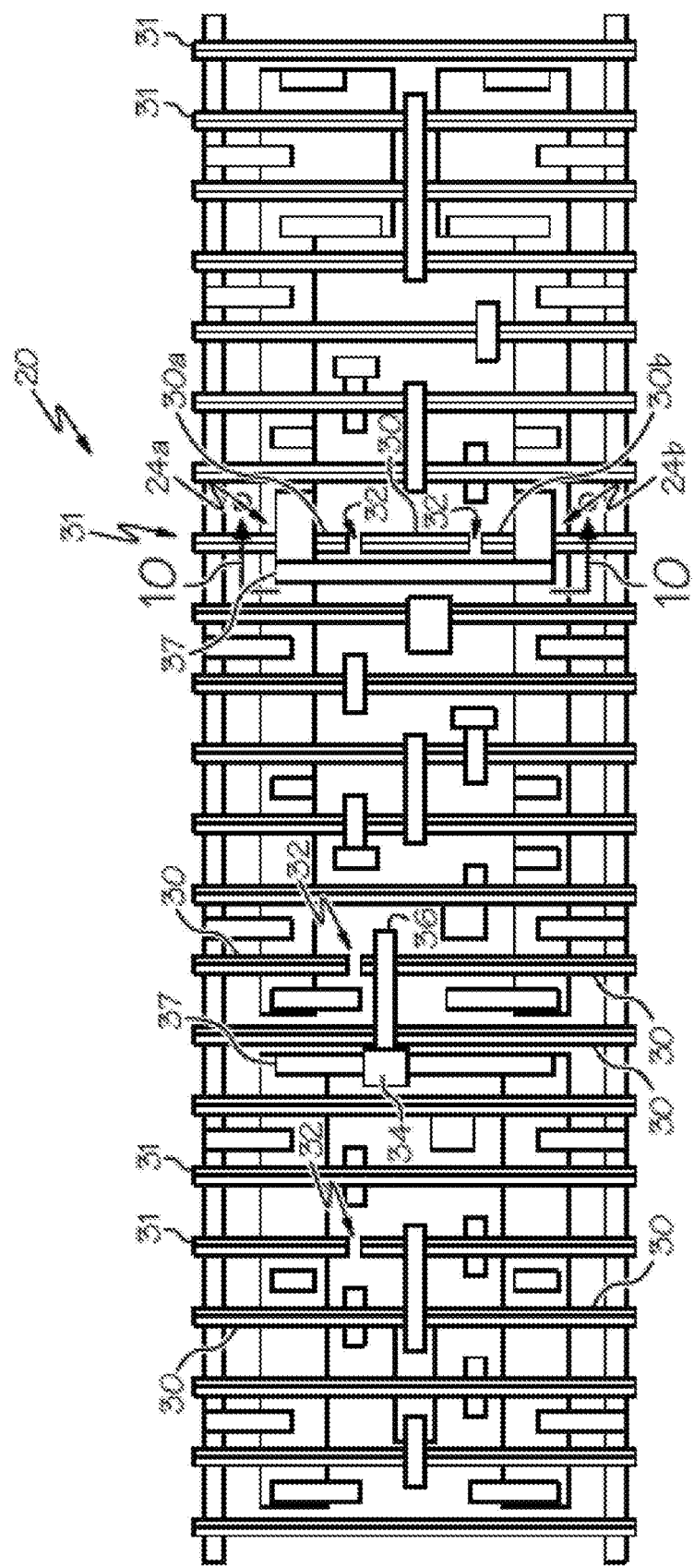
FIG. 2 is a top view of one embodiment of the semiconductor device showing gates of transistors, various local interconnect layers, and trench silicide layers.

As can be seen with reference to FIG. 2, the gates 30 are formed as linear strips 31 generally parallel to one another. Gaps 32 may be formed in the strips 31 such that more than one transistor 30 may be disposed longitudinally along each strip 31. Such gaps 32 may be formed using cut mask techniques as readily appreciated by those skilled in the art.

Figure 3:
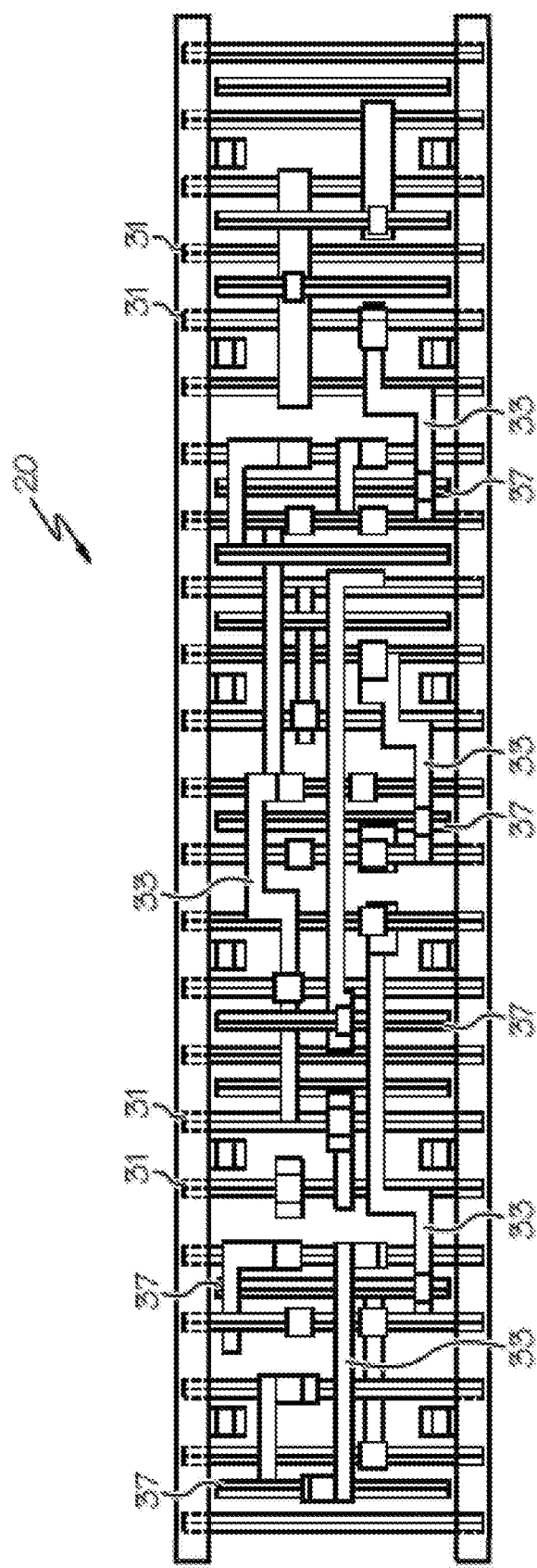
FIG. 3 is a top view of another embodiment of the semiconductor device showing a metal layer disposed above the gates of the transistors and the various local interconnect layers.

Referring to FIGS. 1 and 3, the semiconductor device 20 includes at least one metal layer 33 disposed above the sources 26, drains 28, and gates 30 of the transistors 24 as is appreciated by those skilled in the art. The metal layers 33 facilitate electrical communication between the various logic elements of the device 20 and other logic elements of the device 20 as well as other systems apart from the device 20. The metal layers 33 are routinely labeled and referred to as M1, M2, etc., as is also appreciated by those skilled in the art. In the configuration shown in FIG. 1, one metal layer 33 is disposed about 165 nm above the substrate 22. However, other distances and dimensions for the metal layer 33 may be alternatively realized.

The semiconductor device 20 further includes at least one local interconnect layer 34, 36 to selectively connect the sources 26, drains 28, and gates 30 of the transistors 24 to other sources 26, drains 28, and gates 30 of other transistors 24. The at least one local interconnect layer 34, 36 may also be selectively connected to the at least one metal layer 33. The at least one local interconnect layer 34, 36 is disposed between the at least one metal layer 33 and the substrate 22. Said another way, the metal layer 33 is disposed above the at least one local interconnect layer 34, 36 with respect to the substrate 22. The at least one local interconnect layer 34 of the illustrated embodiments is formed primarily of tungsten. In other embodiments, the at least one local interconnect layer 34, 36 is formed primarily of copper. However, the local interconnect layers 34, 36 may be formed of or include other elements or compounds.

Various embodiments of the semiconductor device 20 showing different shapes, arrangements, and electrical connections of the at least one local interconnect layer 34, 36 are shown in the various figures and described below. A first local interconnect layer 34 is referred to herein as a CA layer 34 and a second local interconnect layer 36 is referred to herein as a CB layer 36. Of course, multiple CA layers 34 and multiple CB layers 36 may be implemented in the semiconductor device 20 and other local interconnect layers (not shown) may also be implemented. Typically, the CA layer(s) 34 electrically connect to sources 26 or drains 28 while the CB layer(s) 36 electrically connect to gates 30. However, such typical configuration should certainly not be viewed as limiting. In fact, in some of the embodiments described below, CA layer(s) 34 and/or CB layer(s) 36 may not be connected to sources 26, drains 28, or gates 30.

The use of the CA and CB layers 34, 36 in the illustrated embodiments may be utilized to produce a variety of standard cells, such as, for example, scan-D flip-flops. In the prior art, a metal layer is typically utilized in to provide the connection for scan-D flip-flops. By utilizing the CA and CB layers 34, 36, which are disposed closer to the substrate than the typical metal layer, the resulting scan-D flip-flops have a reduced area when compared to prior art devices.

The semiconductor device 20 may further include one or more trench silicide layers 37. The trench silicide layer 37 may be utilized to electrically connect the source 26 and/or drain 28 of the transistor 24 to one of the CA or CB layers 34, 36, and typically the CA layer, as shown in FIG. 1. As such, the trench silicide layer 37 is sandwiched between one of the CA or CB layers 34, 36 and the at least one of the source 26 or the drain 28 of the transistor 24. The trench silicide layer 37 is formed by cutting a trench (not separately numbered) in a dielectric (not shown) to the depth of the substrate 22 and filling the trench with a salicide material. For example, the salicide material may be a metal, such as nickel, cobalt, or tungsten.

The trench silicide layer 37 of the configuration shown in FIG. 1 has a height of about 50 nm. The CA layer 34 of FIG. 1 is supported by the trench silicide layer 34 and has a height of about 40 nm. The CB layer 36 of FIG. 1 has a height of about 70 nm. The CA layer 34 and CB layer 36 of FIG. 1 are generally level with one another with respect to the substrate 22. Furthermore, as can be seen in FIG. 1, the CA and CB layers 34, 36 of the illustrated embodiments do not extend more than 105 nm above the substrate 22. Of course, the heights and dimensions of the trench silicide layer 37, the CA layer 34, and the CB layer 36 may be different in alliterative embodiments depending on any number of factors.

The semiconductor device 20 may include a plurality of vias 38 to selectively provide electrical connections between the CA or CB layers 34, 36 and the at least one metal layer 33. As such, one of the vias 38 may be disposed between the at least one metal layer 33, and one of the CA or CB layers 34, 36. The vias 38 are formed primarily of a metal, such as copper. However, other metals or electrically conductive materials may also be suitable. The vias 38 of the configuration shown in FIG. 1 have a height of about 60 nm.

Figure 4:
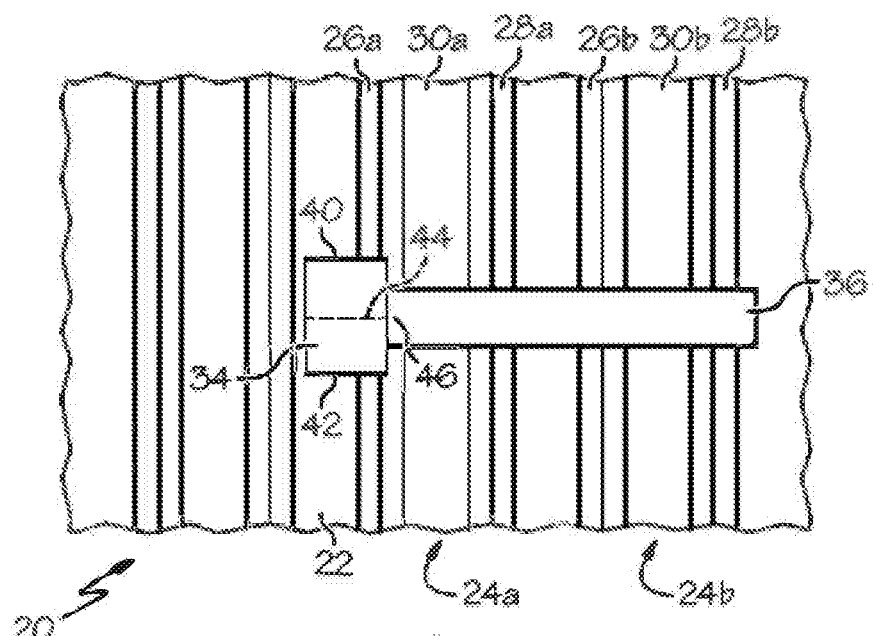
FIG. 4 is a top view of a portion of a first embodiment of the semiconductor device.

In a first embodiment, as shown in FIG. 4, the semiconductor device 20 includes at least a first transistor 24a and a second transistor 24b. The semiconductor device 20 includes a CA layer 34 and a CB layer 36. The CA layer 34 is electrically connected to at least one of the source 26a or the drain 28a of the first transistor 24a. A CB layer 36 is electrically connected to at least one of the gates 30 of the transistors 24a, 24b. Depending on the particular application, the CB layer 36 may be electrically connected to both of the gates 30 of the transistors 24a, 24b. The first and CB layers 34, 36 are also electrically connected to one another.

In the first embodiment, the CA layer 34 extends between a first end 40 and a second end 42. The CB layer 36 is disposed generally at a center 44 of the CA layer 34 between the ends 40, 42. More specifically, an end 46 of the CB layer 36 is disposed generally at the center 44 of the CA layer 34. As such, when viewed from above, the first and CB layers 34, 36 form a long 'T' shape.

A second embodiment of the semiconductor device 20, is substantially similar to the first embodiment, but further includes a trench silicide layer 37 disposed between the CA layer 34 at least one of the source 26 or the drain 28 of the first transistor 24a. Such an arrangement can be seen with reference again to FIG. 1.

Figure 5:
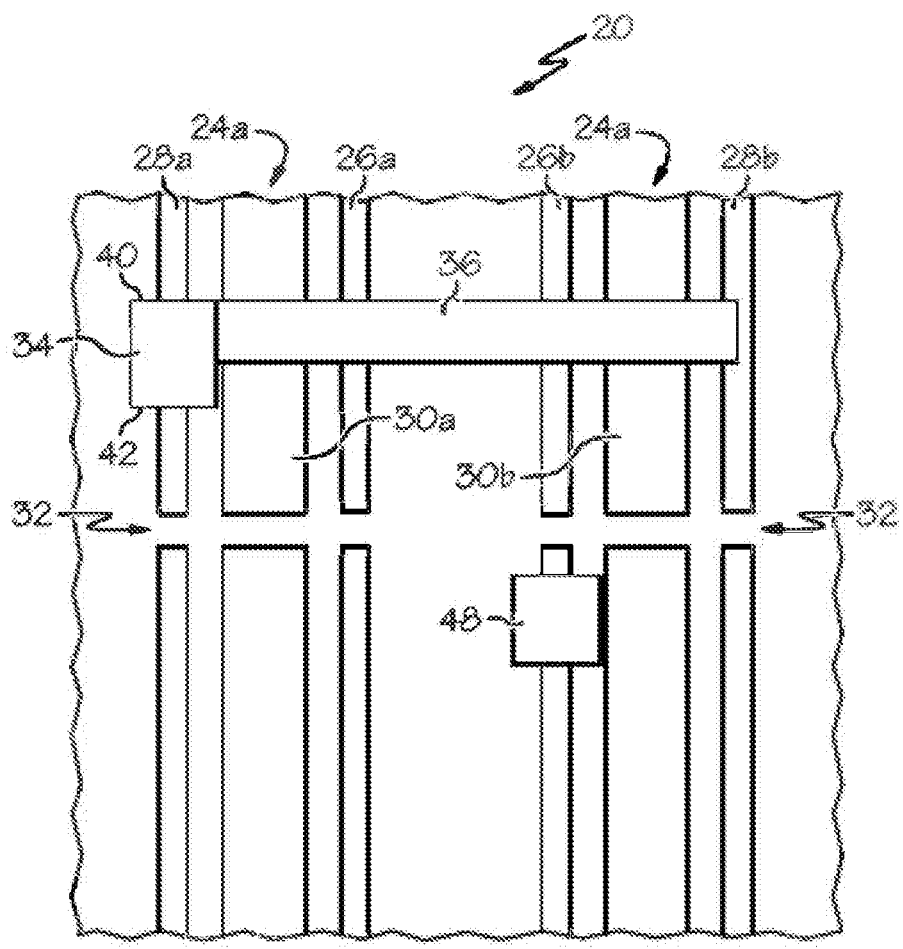
FIG. 5 is a top view of a portion of a second embodiment of the semiconductor device.

In a third embodiment, as shown in FIG. 5, the semiconductor device 20 includes at least the first transistor 24a and the second transistor 24b. The semiconductor device 20 includes a first CA layer 34a and a CB layer 36. The first CA layer 34a is electrically connected to at least one of the source 26a or the drain 28a of the first transistor 24a. The CB layer 36 is electrically connected to at least one of the gates 30a, 30b of the transistors 24a, 24b. Depending on the particular application, the CB layer 36 may be electrically connected to both of the gates 30a, 30b of the transistors 24a, 24b. The first and CB layers 34, 36 are also electrically connected to one another.

In the third embodiment, like the first embodiment, the CA layer 34 extends between the first end 40 and the second end 42. However, in the third embodiment, the CB layer 36 is disposed adjacent one of the ends 40, 42. As such, when viewed from above, the first and CB layers 34, 36 form a long 'L' shape. The long 'L' shape of the third embodiment allows the CB layer 36 to be disposed apart from a second CA layer 48 to prevent electrical conductivity between the CB layer 36 and the second CA layer 48.

Figure 6:
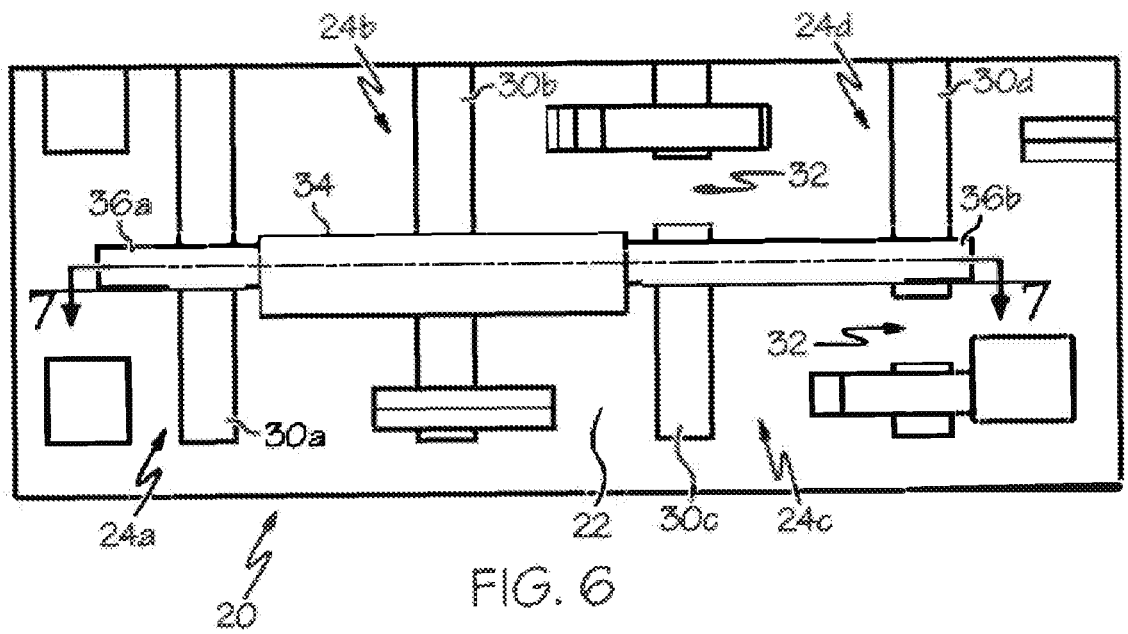
FIG. 6 is a top view of a portion of a fourth embodiment of the semiconductor device.
Figure 7:
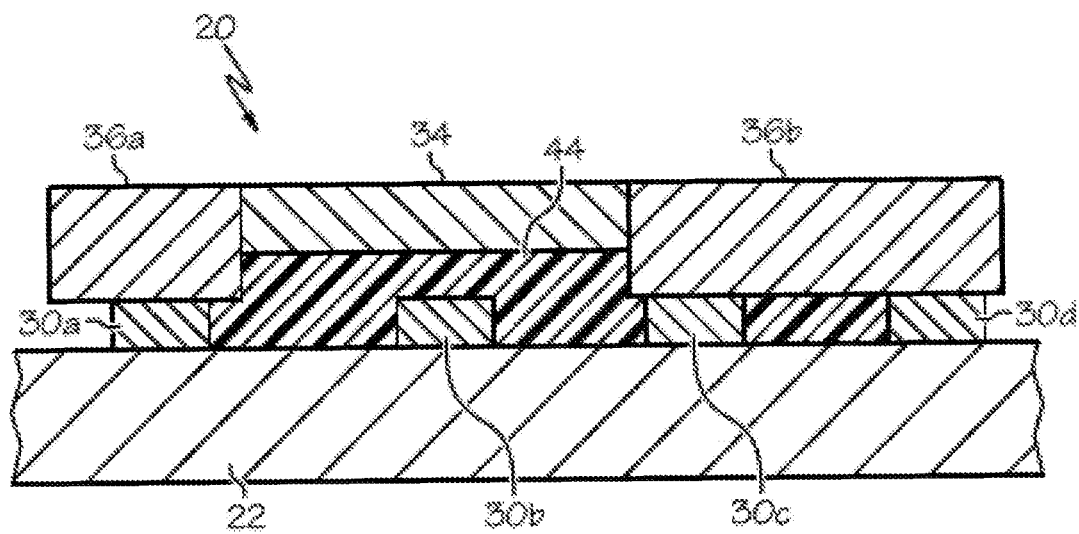
FIG. 7 is a cross-sectional side view the fourth embodiment of the semiconductor according to the line 7-7 shown in shown in FIG. 6.

Referring to FIGS. 6 and 7, a fourth embodiment of the semiconductor device 20 includes a first transistor 24a, a second transistor 24b, and a third transistor 24c formed on the substrate 22. The transistors 24 are disposed sequentially from the first transistor 24a through the third transistor 24c. The device 20 may further include a fourth transistor 24d wherein the transistors 24 are disposed sequentially from the first transistor 24a through the fourth transistor 24d.

A first CB layer 36a is electrically connected to the gate 30a of the first transistor 24a and a second CB layer 36b is electrically connected to the gate 30c of the third transistor 24c. A CA layer 34 electrically connects the first CB layer 36a and the second CB layer 36b to one another. As such, the gate 30 of the first transistor 24a and the gate 30c of the third transistor 24c are electrically connected to one another through the CB layers 36a, 36b and the CA layer 34.

The CA layer 34 is electrically insulated from the gate 30b of the second transistor 24b. As such, the CA layer 34 forms a "bridge" or a "jumper" over the gate 30b of the second transistor 24b. One or more insulating layers 44 may be sandwiched between the CA layer 34 and the gate 30 of the second transistor 24b. The one or more insulating layers 44 may also be sandwiched between the CA layer 36 and the substrate 22.

Depending on the particular logic element needs, the second CB layer 36b may also be electrically connected to the gate 30 of the fourth transistor 24d. Furthermore, the CA layer 34 may also be electrically connected to at least one of the source 26 or the drain 28 of one of the transistors 24a, 24b, 24c. As is shown in FIGS. 6 and 7, the CA layer 34 and the CB layers 34a, 34b are disposed above the gates 30 of the transistors 24a, 24b, 24c, 24d with respect to the substrate 22.

Figure 8:
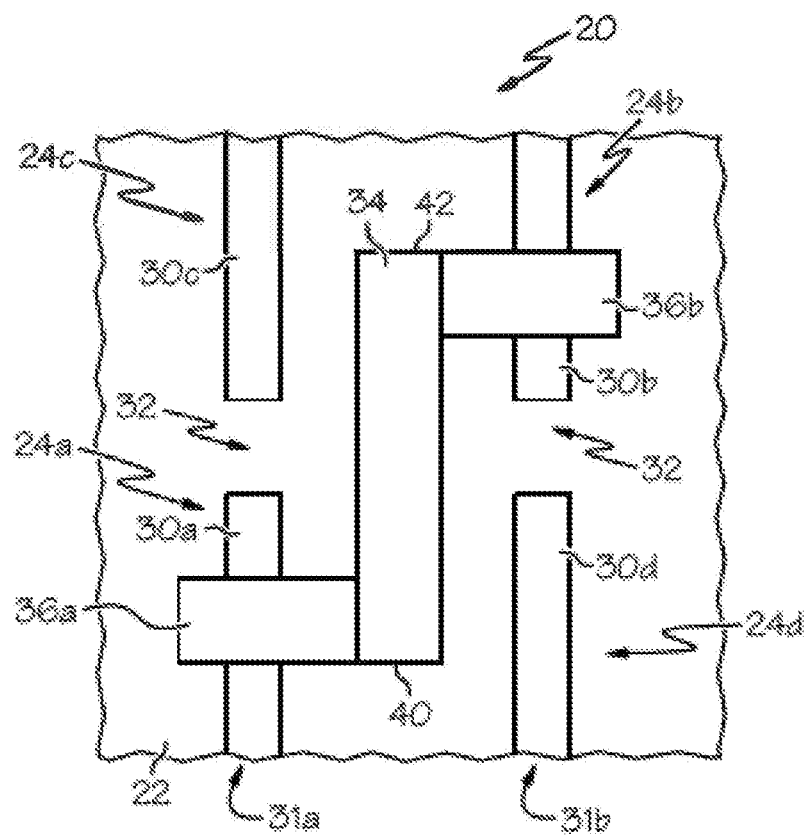
FIG. 8 is a top view of a portion of a fifth embodiment of the semiconductor device.

In a fifth embodiment, the semiconductor device 20 includes a semiconductor substrate 22 with a first transistor 24a and a second transistor 24b disposed on the substrate 22, as illustrated in FIG. 8. A first CB layer 36a is electrically connected to the gate 30a of the first transistor 24a and a second CB layer 36b is electrically connected to the gate 30a of the second transistor 24b. A CA layer 34 extends longitudinally between a first end 40 and a second end 42. The first CB layer 36a is electrically connected to the CA layer 34 adjacent the first end 40 of the CA layer 34. The second CB layer 36b is electrically connected to the CA layer 34 adjacent the second end 42 of the CA layer 34.

The gate 30a of the first transistor 24a extends longitudinally as part of a first linear strip 31a and the gate 30b of the second transistor 24b extends longitudinally as part of a second linear strip 31b. The first and second strips 31a, 31b are generally parallel to one another and spaced apart from one another. The CA layer 34 is generally perpendicular to the first and second CB layers 36a, 36b. As such, the CA layer 34 extends generally parallel to the strips 31a, 31b and is disposed between the strips 31a, 31b. Accordingly, the CA layer 34 and the CB layers 36a, 36b collectively form a zig-zag or generally S-shape when viewed from above.

The semiconductor device 20 of the fifth embodiment may further include a third transistor 24c and a fourth transistor 24d. The gate 30c of the third transistor 24c extends longitudinally as part of the first strip 31a and the gate 30d of the fourth transistor 24d extends longitudinally as part of the second strip 31b. A gap 32 separates the gate 30a of the first transistor 24a from the gate 30c of the third transistor 24c and the gate 30 of the second transistor 24b from the gate 30 of the fourth transistor 24d. As such, the gates 30 of the first and second transistors 24a, 24b are cater-corner from one another and that the CA layer 34 extends across the gap 32.

Figure 9:
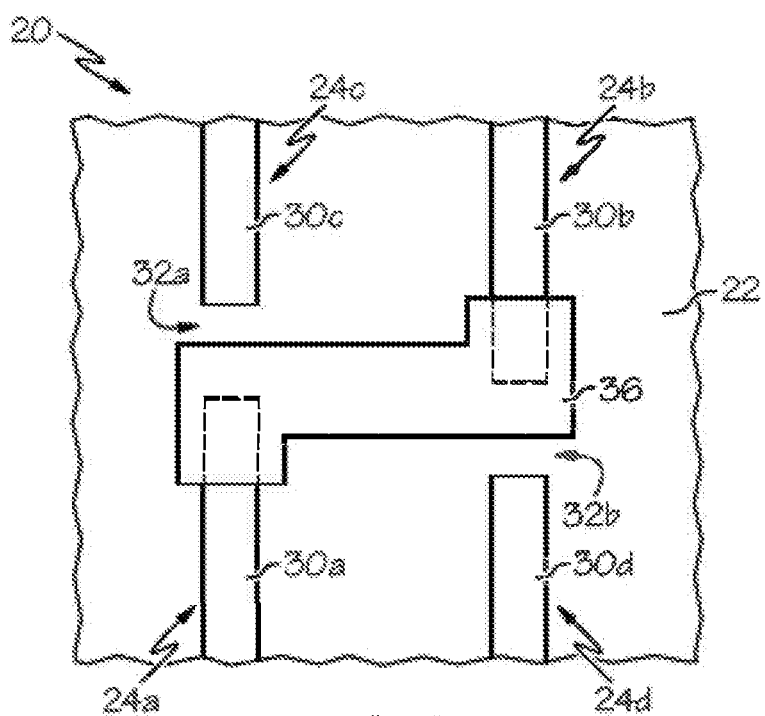
FIG. 9 is a top view of a portion of a sixth embodiment of the semiconductor device.

In a sixth embodiment, as shown in FIG. 9, the semiconductor device 20 includes a semiconductor substrate 22 with a first transistor 24a and a second transistor 24b disposed on the substrate 22. The gates 30a, 30b of the transistors 24a, 24b extend longitudinally and generally parallel to one another. The first gate 30a is formed as part of a first linear strip 31a and the second gate 30b is formed as part of second linear strip 31b. A single CB layer 36 is electrically connected to both of the gates 30 of the first and second transistors 24a, 24b. The gates 30a, 30b of the transistors 24a, 24b may not be directly adjacent one another. As such, the CB layer 36 forms a zig-zag shape to electrically connect both transistors 24a, 24b.

Specifically, as shown in FIG. 9, the device 20 includes a third transistor 24c and a fourth transistor 24d. The gate 30c of the third transistor 24c extends longitudinally as part of the first strip 31a and the gate 30d of the fourth transistor 24d extends longitudinally as part of the second strip 31b. A first gap 32a separates the gate 30a of the first transistor 24a from the gate 30c of the third transistor 24c. A second gap 32b separates the gate 30b of the second transistor 24b from the gate 30d of the fourth transistor 24d. The gaps 32a, 32b of the sixth embodiment are not aligned with one another.

Figure 10:
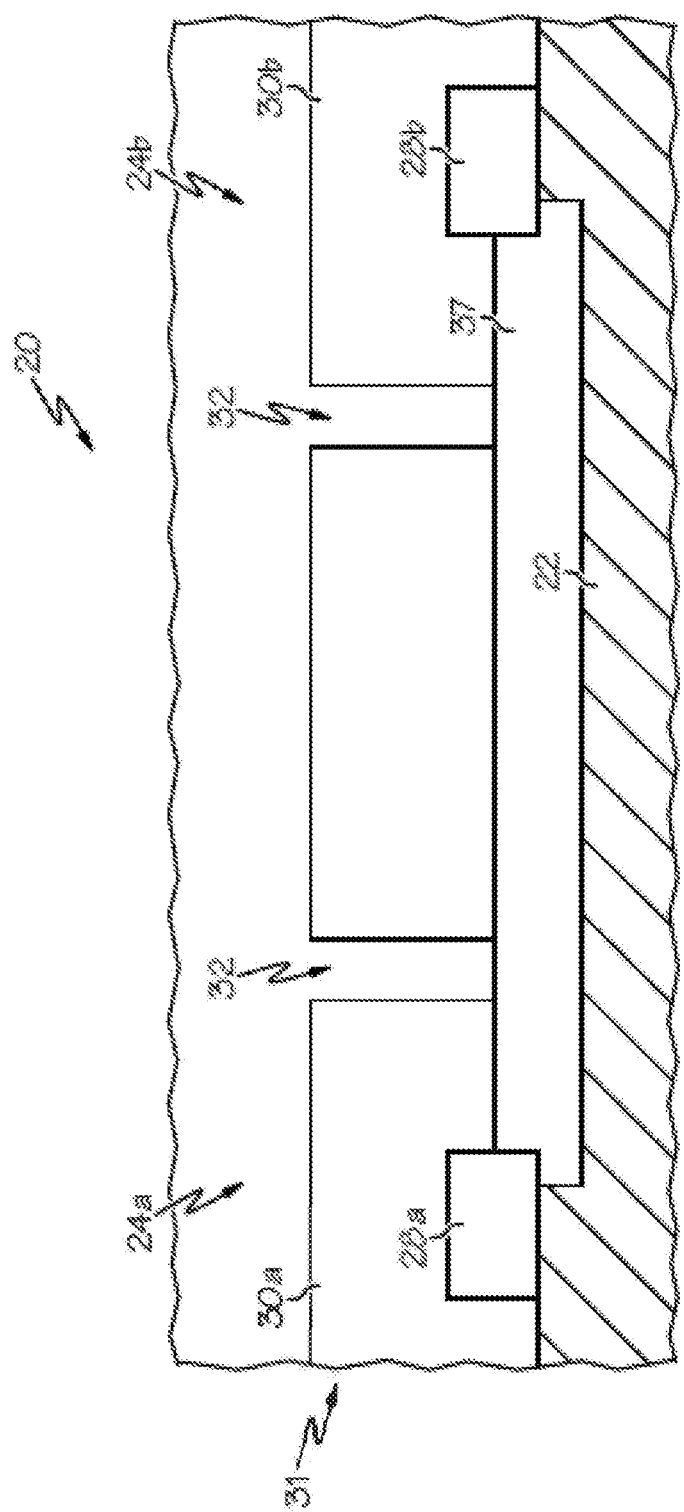
FIG. 10 is a side view of a portion of a seventh embodiment of the semiconductor device according to the line 10-10 shown in FIG. 2.

Referring to FIGS. 2 and 10, the semiconductor device 20 of a seventh embodiment includes a first transistor 24a and a second transistor 24b. A trench silicide layer 37 electrically connects the source 26a or the drain 28a of the first transistor 24a to the source 26b or the drain 28b of the second transistor 24b. Specifically, FIG. 10 shows the first transistor 24a being an n-type FET and the second transistor 24b being a p-type FET and that the raised drains 28a, 28b of the transistors 24a, 24b are electrically connected to one another via the trench silicide layer 37.

The gate 30a of the first transistor 24a and the gate 30b of the second transistor 24b are formed from a common linear strip 31. As such, the gates 30a, 30b extend linearly with respect to one another. The trench silicide layer 37 is disposed on one side of the gates 30a, 30b. That is, the trench silicide layer 37 does not cross over the gates 30a, 30b or the common linear strip 31 while still electrically connecting the drains 28a, 28b of the transistors 24a, 24b. Said another way, the trench silicide layer 37 need not cross a "poly boundary" formed by the linear strip 31. This arrangement may be utilized to produce scan scan-D flip-flops. The resulting scan-D flip-flops have a reduced area when compared to prior art devices. Of course, the arrangement may be utilized in producing logic devices other than the scan-D flip-flops, as will be realized by those skilled in the art.

The semiconductor device 20 of the seventh embodiment may also include a single-sided contact (not shown) electrically connected to each gate 30a, 30b of the transistors 24a, 24b. By utilizing a single-sided contact, i.e., a contact that does not extend over the entire width of the gates 30a, 30b, the risk of dielectric breakdown between the trench silicide layer 37 and the gates 30a, 30b is reduced.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor device comprising:
a semiconductor substrate;
a first transistor and a second transistor formed on the semiconductor substrate, wherein each transistor comprises a source, a drain, and a gate, wherein the gate of the first transistor extends longitudinally as part of a first linear strip and wherein the gate of the second transistor extends longitudinally as part of the second linear strip parallel to and spaced apart from the first linear strip;
a first CB layer forming a local interconnect layer electrically connected to the gate of the first transistor;
a second CB layer forming a local interconnect layer electrically connected to the gate of the second transistor;
a CA layer forming a local interconnect layer extending longitudinally between a first end and a second end of the CA layer, wherein the CA layer is electrically connected to the first and second CB layers;
wherein the first CB layer is electrically connected adjacent the first end of the CA layer and the second layer is electrically connected adjacent the second end of the CA layer,
wherein the first CB layer, the second CB layer and the CA layer are disposed between a first metal layer and the semiconductor substrate, the first metal layer being disposed above each source, each drain, and each gate of the first and second transistors, and
wherein the CA layer extends substantially parallel to the first and second linear strips and is substantially perpendicular to the first and second CB layers; and
at least one via selectively providing an electrical connection between the CA or CB layers and the at least one metal layer.

2. The semiconductor device according to claim 1, wherein the at least one via selectively provides an electrical connection between the CA layer and the at least one metal layer.

3. The semiconductor device according to claim 2, wherein the at least one metal layer is the first metal layer.

4. The semiconductor device according to claim 1, wherein the at least one via selectively provides an electrical connection between one of the CB layers and the at least one metal layer.

5. The semiconductor device according to claim 4, wherein the at least one metal layer is the first metal layer.

6. The semiconductor device according to claim 1, wherein the at least one via and the CA layer are formed of substantially different materials.

7. The semiconductor device according to claim 6, wherein the at least one via includes copper and the CA layer includes tungsten.

8. The semiconductor device according to claim 1, wherein the CA layer is disposed between the gate of the first transistor and the gate of the second transistor.

9. The semiconductor device according to claim 8, wherein the CA layer extends substantially parallel to the first linear strip and the second linear strip.

10. The semiconductor device according to claim 9, further comprising a third transistor having a gate extending longitudinally along the first linear strip and a fourth transistor having a gate extending longitudinally along the second linear strip.

11. The semiconductor device according to claim 10, wherein the gate of the first transistor and the gate of the third transistor are separated by a gap, and wherein the gate of the second transistor and the gate of fourth transistor are separated by a gap.

12. The semiconductor device according to claim 11, wherein the CA layer, the first CB layer, and the second CB layer each terminate at an uppermost surface, and wherein the uppermost surface of the CA layer, the uppermost surface of the first CB layer, and the uppermost surface of the second CB layer are at a height above the semiconductor substrate.

13. The semiconductor device according to claim 1 wherein the first CB layer and the second CB layer each have a height of about 70 nm.

\* \* \* \* \*